United States Patent

Peeters et al.

(10) Patent No.: US 8,822,139 B2
(45) Date of Patent: Sep. 2, 2014

(54) METHOD FOR PROVIDING AN ORDERED LAYER OF SELF-ASSEMBLABLE POLYMER FOR USE IN LITHOGRAPHY

(75) Inventors: Emiel Peeters, Eindhoven (NL); Sander Frederik Wuister, Eindhoven (NL); Roelof Koole, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 33 days.

(21) Appl. No.: 13/640,293

(22) PCT Filed: Jan. 19, 2011

(86) PCT No.: PCT/EP2011/050668
§ 371 (c)(1),
(2), (4) Date: Oct. 9, 2012

(87) PCT Pub. No.: WO2011/128120
PCT Pub. Date: Oct. 20, 2011

(65) Prior Publication Data
US 2013/0034811 A1 Feb. 7, 2013

Related U.S. Application Data

(60) Provisional application No. 61/324,184, filed on Apr. 14, 2010.

(51) Int. Cl.
*G03F 7/26* (2006.01)
*B29C 59/00* (2006.01)
*C08G 83/00* (2006.01)
*B82Y 40/00* (2011.01)
*B82Y 10/00* (2011.01)
*G03F 7/00* (2006.01)

(52) U.S. Cl.
CPC ............. *G03F 7/0002* (2013.01); *B82Y 40/00* (2013.01); *B82Y 10/00* (2013.01)
USPC ........... 430/322; 430/330; 430/328; 430/394; 430/270.1; 525/50

(58) Field of Classification Search
CPC ....... G03F 7/0002; G03F 7/004; G03F 7/165; G03F 7/26; G03F 7/40; G03F 7/0392; G03F 7/38; G03F 7/0045; G03F 7/0382; G03F 7/203; G03F 7/00; C08F 293/00; H01L 21/0273; H01L 21/31144; H01L 21/67115; H01L 21/0274
USPC .................................................. 430/322, 330
See application file for complete search history.

(56) References Cited

U.S. PATENT DOCUMENTS

| 7,521,090 | B1 | 4/2009 | Cheng et al. |
| 7,521,094 | B1 | 4/2009 | Cheng et al. |

(Continued)

FOREIGN PATENT DOCUMENTS

| TW | 200913014 | 3/2009 |
| WO | 2008/145268 | 12/2008 |

(Continued)

OTHER PUBLICATIONS

International Search Report mailed Aug. 2, 2011 in corresponding International Patent Application No. PCT/EP2011/050668.

(Continued)

*Primary Examiner* — Caleen Sullivan
(74) *Attorney, Agent, or Firm* — Pillsbury Winthrop Shaw Pittman LLP

(57) ABSTRACT

A method for providing an ordered polymer layer at a surface of a substrate includes depositing a self-assemblable polymer layer directly onto a primer layer on a substrate to provide an interface between the self-assemblable polymer layer and the primer layer, and treating the self-assemblable polymer layer to provide self-assembly into an ordered polymer layer, such as a block copolymer, having first and second domain types at the interface. The primer layer is adapted to improve its chemical affinity to each domain type at the interface, in response to the presence of the respective domain type in the self-assembled polymer at the interface during the self-assembly of the self-assemblable polymer layer into the ordered polymer layer. This may lead to reduction in defect levels and/or improved persistence length for the ordered polymer layer. The method may be useful for forming resist layers for use in device lithography.

20 Claims, 6 Drawing Sheets

(56) References Cited

U.S. PATENT DOCUMENTS

| | | |
|---|---|---|
| 8,039,196 B2 | 10/2011 | Kim et al. |
| 2004/0175628 A1* | 9/2004 | Nealey et al. ............ 430/1 |
| 2008/0233323 A1 | 9/2008 | Cheng et al. |
| 2009/0035668 A1 | 2/2009 | Breyta et al. |
| 2009/0181171 A1 | 7/2009 | Cheng et al. |

FOREIGN PATENT DOCUMENTS

| | | |
|---|---|---|
| WO | 2009/099924 | 8/2009 |
| WO | 2011/080016 | 7/2011 |

OTHER PUBLICATIONS

Miri Park et al., "Block Copolymer Lithography: Periodic Arrays of ~$10^{11}$ Holes in 1 Square Centimeter," Science, vol. 276, pp. 1401-1404 (May 30, 1997).

XiaoMin Yang et al., "Directed Block Copolymer Assembly versus Electron Beam Lithography for Bit-Patterned Media with Areal Density of 1 Terabit/inch$^2$ and Beyond," ACS Nano, vol. 3, No, 7, pp. 1844-1858 (Jul. 1, 2009).

Richard D. Peters et al., "Combining advanced lithographic techniques and self-assembly of thin films of diblock copolymers to produce templates for nanofabrication," J. Vac. Sci. Technol, B, vol. 18, No. 6, pp. 3530-3534 (Nov./Dec. 2000).

Erik W. Edwards et al., "Binary blends of diblock copolymers as an effective route to multiple length scales in perfect directed self-assembly of diblock copolymer thin films," J. Vac. Sci. Technol. B, vol. 24, No. 1, pp. 340-344 (Jan./Feb. 2006).

Shengxiang Ji et al., "Preparation of Neutral Wetting Brushes for Block Copolymer Films from Homopolymer Blends," Adv. Mater., vol. 20, pp. 3054-3060 (2008).

Yeon Sik Jung et al., "A Path to Ultranarrow Patterns Using Self-Assembled Lithography," Nano Lett., vol. 10, pp. 1000-1005 (Feb. 10, 2010).

Ricardo Ruiz et al., "Induced Orientational Order in Symmetric Diblock Copolymer Thin Films," Adv. Mater., vol. 19, pp. 587-591 (2007).

* cited by examiner

METHOD FOR PROVIDING AN ORDERED LAYER OF SELF-ASSEMBLABLE POLYMER FOR USE IN LITHOGRAPHY

CROSS-REFERENCE TO RELATED APPLICATIONS

This application is the United States national phase entry of PCT patent application no. PCT/EP2011/050668, filed Jan. 19, 2011 (published as PCT patent application publication no. WO 2011/128120), which claims the benefit under 35 USC §119(e) of U.S. provisional patent application No. 61/324,184, filed on Apr. 14, 2010, the contents of each of the foregoing documents incorporated herein in its entirety by reference.

FIELD

The present invention relates to a method for manufacture of devices by lithography. In particular, the invention relates to a method for reduction of defects in a resist layer, particularly a resist layer of self-assembled block copolymers.

BACKGROUND

In lithography for device manufacture, there is an ongoing desire to reduce the size of features in a lithographic pattern in order to increase the density of features on a given substrate area. Patterns of smaller features having a critical dimension (CD) at nano-scale allow for greater concentrations of device or circuit structures, yielding potential improvements in size reduction and manufacturing costs for electronic and other devices. In photolithography, the push for smaller features has resulted in the development of technologies such as immersion lithography and extreme ultraviolet (EUV) lithography.

So-called imprint lithography generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

For both photolithography and for imprint lithography, it is desirable to provide high resolution patterning of surfaces of imprint templates or of other substrates, and chemical resists may be used to achieve this.

SUMMARY

The use of self-assembly of block copolymers (BCPs) has been considered as a potential method for improving the resolution to better values than those obtainable by prior art lithography methods or as an alternative to electron beam lithography for preparation of imprint templates.

Self-assemblable block copolymers are materials useful in nanofabrication because they may undergo an order-disorder transition on cooling below a certain temperature (order-disorder transition temperature $T_{O/d}$) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have widths of the order of 1-5 nm and may be manipulated by modification the chemical compositions of the blocks of the copolymers.

The feasibility of using thin films of block copolymers as templates was demonstrated by Chaikin and Register, et al., Science 276, 1401 (1997). Dense arrays of dots and holes with dimensions of 20 nm were transferred from a thin film of poly(styrene-block-isoprene) to silicon nitride substrates.

Block copolymers comprise different blocks of identical monomers arranged side-by side along the polymer chain. Each block may contain many monomers of its respective type. So, for instance, an A-B block copolymer may have a plurality of type A monomers in each A block and a plurality of type B monomers in each B block. An example of a suitable block copolymer is, for instance, a polymer having covalently linked blocks of polystyrene monomers (hydrophobic block) and polymethylmethacrylate (PMMA) monomers (hydrophilic block). Other block copolymers with blocks of differing hydrophobicity/hydrophilicity may be useful. For instance triblock copolymers may be useful. The blocks are connected to each other by covalent links in a linear or branched fashion (e.g. star or branched configuration).

Block copolymers may form many different phases upon self-assembly, dependent upon the volume fractions of the blocks, degree of polymerization within each block type (i.e. number of monomers of each respective type within each respective block), and/or the optional use of solvents and surface interactions. When applied in thin films, the geometric confinement may pose additional boundary conditions that may limit the numbers of phases. In general only spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled block copolymers, and the phase type observed may depend upon the relative volume fractions of the different polymer blocks.

The self-assembled block copolymer phases may orient with symmetry axes parallel or perpendicular to the substrate and lamellar and cylindrical phases are most interesting for lithography applications, as they may form line and spacer patterns and hole arrays, respectively, and may provide good contrast when one of the domain types is subsequently etched.

Two methods used to guide self-assembly of block copolymers onto surfaces are graphoepitaxy and chemical pre-patterning. In the graphoepitaxy method, self-organization of block copolymers is guided by topological pre-patterning of the substrate. Self-aligned block copolymers can form parallel linear patterns with adjacent lines of the different polymer block domains in the trenches defined by the patterned substrate. For instance if the block copolymer is a di-block copolymer with A and B blocks within the polymer chain, where A is hydrophilic and B is hydrophobic in nature, the A blocks may assemble into domains formed adjacent to a side-wall of a trench if the side-wall is hydrophilic in nature. Resolution may be improved over the resolution of the patterned substrate by the block copolymer patterns subdividing the spacing of pre-patterns on the substrate.

In the chemical pre-patterning method, the self-assembly of block copolymer domains is guided by chemical patterns on the substrate. Chemical affinity between the chemical patterns and at least one of the types of copolymer blocks within the polymer chain may result in the precise placement of one of the domain types onto a corresponding region of the chemical pattern on the substrate. For instance if the block copolymer is a di-block copolymer with A and B blocks, where A is hydrophilic and B is hydrophobic in nature, and the chemical pattern comprises hydrophobic regions on a hydrophilic surface, the B domains may preferentially assemble onto the hydrophobic regions. As with the graphoepitaxy method of alignment, the resolution may be improved over the resolution of the patterned substrate by the block copolymer patterns subdividing the spacing of the pre-patterned features on the substrate (so-called density multiplication). Chemical pre-patterning is not limited to linear pre-patterns; for instance the pre-pattern may be in the form of a 2-D array of dots suitable as a pattern for use with a cylindrical phase-forming block copolymer. Graphoepitaxy and chemical pre-patterning may be used to guide the self-organization of lamellar, cylindrical phases.

In a typical process to implement the use of block copolymer self assembly in nanofabrication, a substrate may be modified with an orientation control layer to induce the preferred orientation of the self-assembly pattern in relation to the substrate. For some block copolymers used in self-assemblable polymer layers, there may be a preferential interaction between one of the blocks and the substrate surface that may result in orientation. For instance, for a polystyrene/PMMA block copolymer, the PMMA block will preferentially wet (i.e. have a high chemical affinity with) oxide surfaces and this may be used to induce the self-assembled pattern to lie oriented parallel to the plane of the surface. Perpendicular orientation may be induced, for instance, by rendering the substrate surface neutral to both blocks, in other words having a similar chemical affinity for each block, such that both blocks wet the surface in a similar manner. Commonly, neutral surfaces may be created by use of random copolymer brushes which are covalently linked to the substrate surface by reaction of a hydroxyl terminal group, or some other reactive end group, to oxide at the substrate surface. Alternatively or additionally, crosslinkable random copolymers or appropriate silanes can be used to render surfaces neutral by acting as an intermediate layer between the substrate surface and the layer of self-assemblable polymer. An intermediate layer between the substrate and the layer of self-assemblable block polymer, onto which the self-assemblable block polymer layer is directly deposited, is referred to hereinafter as a primer layer. The primer layer may be provided with gaps to permit one of the block types of the self-assemblable layer to come into direct contact with the substrate below the primer layer. This may be useful for anchoring or aligning a domain of a particular block type of the self-assemblable polymer layer to the substrate.

The substrate may be further provided with a topological or chemical pre-pattern as set out above to guide the self-assembly pattern. A thin layer of self-assemblable block copolymer is typically deposited on the substrate, typically onto an intermediate neutral or primer layer as set out above. A suitable method for deposition is spin coating as it is capable of providing a well defined, uniform, thin layer. A suitable layer thickness for a deposited block copolymer film is approximately 10 to 100 nm. Following deposition of the block copolymer film, the film may still be disordered or only partially ordered and additional steps may be needed to promote and/or complete self-assembly.

The block copolymers self-assemble into a highly ordered regular pattern. The self-assembly process typically occurs most readily at a temperature above the glass-transition temperature and below the order-disorder temperature for the block copolymer. This stage is referred to as ordering, and is generally achieved by uniform heating. The self-assembly process may nucleate at multiple points in the block copolymer film and this may result in the formation of defects.

Defects formed during ordering as set out above may be partly removed by annihilation comprising, e.g., annealing. Defects such as disclinations (which are line defects in which rotational symmetry is violated, e.g. where there is a defect in the orientation of a director) may be annihilated by pairing with other defects or disclinations of opposite sign. Chain mobility of the block copolymer may be a significant factor for determining defect migration and annihilation and so annealing may be carried out at a temperature where chain mobility is high but the self-assembled ordered pattern is not lost. This implies a temperature up to a few ° C. above or below the order/disorder temperature To/d. Unfortunately, some isolated defects are hard to annihilate. They have a high immobility which may be attributable to high energy input required to restructure the ordered surroundings of such defects.

The ordering and defect annihilation may be combined into a single annealing process.

Although the techniques set out above for applying block copolymer self-assembled layers to surfaces provide partial alignment of the block copolymer structure on a surface, the resulting self-assembled layers may have high levels of incorrectly aligned polymer molecules, leading to defects in the resulting self-assembled layer.

Layers of self-assembled block copolymers, after directed ordering and defect reduction through annealing, may exhibit a defect rate of 1 in $10^3$ to 1 in $10^4$, expressed as the number of non-functional features of a multi-component device derived from the self-assembled layer (see, for example, Yang et. al, ACS Nano, 2009, 3, 1844-1858).

Self-assembly of block copolymers is a process where the assembly of many small components (the block copolymers) results in the formation of larger more complex structures (the nanometer sized features in the self-assembly pattern) and the defects arise naturally from the physics controlling the self assembly of the polymers. Self-assembly is driven by the differences in interactions (i.e. differences in mutual chemical affinity) between A-A, B-B and A-B blocks of an A-B block copolymer, with the driving force for phase separation described by Flory-Huggins theory for the system under consideration.

For block copolymers which undergo self-assembly, the block copolymer will exhibit an order-disorder temperature To/d. To/d may be measured by any suitable technique for assessing the ordered/disordered state of the polymer, such as differential scanning calorimetry (DSC). If layer formation takes place below this temperature, the molecules will be driven to self-assemble. Above the temperature To/d, a disordered layer will be formed with the entropy contribution from disordered A/B domains outweighing the enthalpy contribution arising from favorable interactions between neighboring A-A and B-B blocks in the layer. The block copolymer may also exhibit a glass transition temperature Tg below which the polymer is effectively immobilized and above which the copolymer molecules may still reorient within a layer relative to neighboring copolymer molecules. The glass transition temperature is suitably measured by DSC.

If To/d is less than Tg for the block copolymer, then a self-assembled layer will be unlikely to form or will be highly defected because of the inability of the molecules to align correctly when below To/d and below Tg. A desirable block copolymer for self assembly has To/d higher than Tg. However, once the molecules have assembled into a solid-like layer, even when annealed at a temperature above Tg but below To/d, the mobility of the polymer molecules may be insufficient to provide adequate defect removal by annealing. Multiple annealing may be carried out to give improvements in defect levels, but this may take considerable time. Another option is to anneal the layer just above To/d to provide sufficient mobility to the polymer molecules to remove defects. However, annealing at a temperature far above To/d or for a too long period may result in disordering of the film. A way of annealing above To/d is by sequential temperature cycles just above and below To/d, for instance up to a few ° C. such as 5° C. above or below To/d.

Limited pattern persistence length and high defect densities may limit the usefulness of self-assemblable polymers, such as block copolymers, for use in the semiconductor industry. Both the pattern persistence length of an ordered polymer layer and its defect density may be influenced by the interfacial energies at the interface between the substrate and the ordered polymer layer. For many applications a perpendicular orientation of the self-assembled pattern, relative to the substrate, is desirable and a typical way to achieve this is by modifying the surface to provide a layer neutral to both blocks onto which a block copolymer may be deposited. In other words, establishing a layer with a similar chemical affinity for both blocks is desirable. However, such a neutral surface may lead to a high interfacial energy at the interface between the substrate and each block following self-assembly into an ordered polymer layer exhibiting separated domains of the different blocks. This free energy penalty may increase the likelihood of instabilities and defect formation in the self-assembled ordered polymer layer. This may result in limited persistence lengths and high defect rates.

Hence, it is desirable, for example, to provide a method and/or composition which tackles one or more problems of the art regarding defect levels and/or persistence length for self-assembled block copolymer layers, for instance a method and/or composition which allows for improvement in defect levels and/or in persistence length and/or which provides reduction in defect levels and/or enhancement of persistence length in shorter times, and/or which allows for formation of a self-assembled polymer layer having a low defect level and/or with a high persistence length.

It is desirable, for example, to provide a method and/or composition useful for providing a self-assembled layer of block copolymers, suitable for use in device lithography, which has low defect levels. It is desirable, for example, to provide a method and/or composition for reducing defect levels in a self-assembled layer.

Throughout this specification, the term "comprising" or "comprises" means including the component(s) specified but not to the exclusion of the presence of others. The term "consisting essentially of" or "consists essentially of" means including the components specified but excludes other components except for materials present as impurities, unavoidable materials present as a result of processes used to provide the components, and components added for a purpose other than achieving the technical effect of the invention. Typically, a composition consisting essentially of a set of components will comprise less than 5% by weight, typically less than 1% by weight of non-specified components.

Whenever appropriate, the use of the term "comprises" or "comprising" may also be taken to include the meaning "consists essentially of" or "consisting essentially of".

According to an aspect, there is provided a method for providing an ordered polymer layer at a surface of a substrate comprising:

depositing a self-assemblable polymer layer directly onto a primer layer on a substrate to provide an interface between the self-assemblable polymer layer and the primer layer, and treating the self-assemblable polymer layer to provide self-assembly into an ordered polymer layer comprising first and second domain types at the interface, wherein the primer layer is adapted to improve its chemical affinity for the first domain type at first loci of the interface, in response to the presence of that first domain type in the self-assembled polymer at those first loci, during the self-assembly of the self-assemblable polymer layer into the ordered polymer layer.

The primer layer may be adapted to improve its chemical affinity for the second domain type at second loci of the interface, in response to the presence of that second domain type in the self-assembled polymer at those second loci, during the self-assembly of the self-assemblable polymer layer into the ordered polymer layer.

The following features are applicable to all the various aspects of the methods and compositions described herein where appropriate. When suitable, combinations of the following features may be employed as part of the methods and compositions, for instance as set out in the claims. The methods and compositions herein may be particularly suitable for use in device lithography. For instance the methods and compositions may be used for treatment or formation of a resist layer of self-assembled polymer for use in patterning a device substrate directly or for use in patterning an imprint template for use in imprint lithography.

The self-assemblable polymer may be a block copolymer as set out hereinbefore comprising at least two different block types which are self-assemblable into an ordered polymer layer having the different block types associated into first and second domain types. Suitable block copolymers for use as self-assemblable polymer include, but are not limited to, poly (styrene-block-methylmethacrylate), poly(styrene-block-2-vinylpyrididne), poly(styrene-block-butadiene), poly(styrene-block-ferrocenyldimethylsilane), poly(styrene-block-ethylenoxide), poly(ethyleeneoxide-block-isoprene). Although the description hereinafter describes using di-block copolymers as examples, it will be apparent that embodiments of the invention may be, in addition or alternatively, suitable for use with triblock, tetrablock or other multi-block copolymers.

By chemical affinity, in this specification, is meant the tendency of two differing chemical compounds to associate together. For instance, chemical compounds which are hydrophilic in nature have a high chemical affinity for water whereas hydrophobic compounds have a low chemical affinity for water but a high chemical affinity for alkanes. The chemical affinity is related to the free energy associated with an interface between two chemical compounds: if the interfacial free energy is high, then the two compounds have a low chemical affinity for each other whereas if the interfacial free energy is low, then the two compounds have a high chemical affinity for each other.

By first and second loci at the interface are meant positions or areas at the interface. Typically, these loci will be determined by the domains formed as the self-assemblable polymer is brought into an ordered state so that a periodic structure is formed with first and second loci corresponding to the positions of first and second domain types respectively of the ordering polymer layer alternating at the interface.

The primer layer may typically be a layer deposited, for instance, by spin-coating onto the substrate, by dip coating, and/or by reaction of compounds such as brush (co)polymers with reactive end groups adapted to bond to the substrate (e.g. from solution or by vacuum deposition).

The self-assemblable polymer layer may typically be a layer deposited, for instance, by spin-coating onto the substrate.

The primer layer may have a glass transition temperature Tg'. The glass transition temperature is suitably measured by differential scanning calorimetry (DSC). The self-assemblable polymer may have a glass transition temperature Tg. The glass transition temperature is suitably measured by DSC.

The primer layer may comprise first and second chemical species, the first chemical species having a greater chemical affinity than the second chemical species for the first domain type, and the second chemical species having a greater chemical affinity than the first chemical species for the second domain type, wherein the first chemical species repositions towards the first loci at the interface in response to the presence of the first domain type at those first loci, during the self-assembly of the self-assemblable polymer layer into the ordered polymer layer.

By "chemical species" in this specification is meant either a chemical compound such as a molecule, oligomer or polymer, or, for in the case of an amphiphilic molecule (i.e. a molecule having at least two interconnected moieties having differing chemical affinities), the term "chemical species" may refer to the different moieties of such molecules. For instance, in the case of a di-block copolymer, the two different polymer blocks making up the block copolymer molecule are considered as two different chemical species having differing chemical affinities.

The term "repositions" in this specification, as applied to chemical species repositioning towards loci at the interface, may mean, for a chemical species which is free to diffuse, that the chemical species diffuses towards the loci. Where a chemical species is part of a molecule which is not free to diffuse, for instance because another part of the molecule is bonded to the substrate, then "repositions" may mean that the conformation of the molecule, of which the chemical species forms a part, may change in order to bring the chemical species into closer proximity with the loci. This may be achieved, for instance by modification of the secondary or tertiary structure of the molecule (i.e. by folding, twisting, bending, etc.).

The second chemical species may also reposition towards the second loci at the interface in response to the presence of the second domain type at those second loci, during the self-assembly of the self-assemblable polymer layer into the ordered polymer layer.

For instance, in an embodiment, the second chemical species may be a polymeric matrix having the first chemical species distributed therein. For this embodiment, a composition comprising a reactive monomer and a non-reactive compound may be deposited onto the surface of the substrate and the monomer reacted to form the polymer matrix as second chemical species having the non-reactive compound as first chemical species substantially homogeneously distributed therein to provide the primer layer.

In another process for obtaining such an embodiment a composition comprising a cross-linkable polymer and a non-reactive compound may be deposited onto the surface of the substrate and the cross-linkable polymer reacted to form the polymer matrix as second chemical species having the non-reactive compound as first chemical species substantially homogeneously distributed therein to provide the primer layer.

In an embodiment, the primer layer may comprise a substantially homogeneous distribution of a first polymer having a chemical affinity for the first domain type as first chemical species and a second polymer having a chemical affinity for the second domain type as second chemical species, the first and second polymers each having an end group adapted to bond an end of its respective polymer to the substrate.

In an embodiment, the primer layer may comprise a di-block copolymer, different from the self-assemblable polymer layer forming the ordered polymer layer, the di-block copolymer having a first block having a chemical affinity for the first domain type as first chemical species and a second block having a chemical affinity for the second domain type as second chemical species.

For this embodiment, the di-block copolymer may have an end group adapted to bond an end of the block copolymer to the substrate.

In an embodiment, the primer layer may comprise a branched tri-block copolymer having a first block having a chemical affinity for the first domain type as first chemical species, and a second block having a chemical affinity for the second domain type as second chemical species, each bonded to a first end of a third block, wherein an opposed second end of the third block has an end group adapted to bond the second end of the third block to the substrate.

For all aspects, the primer layer may exhibit a glass transition temperature Tg' and the self-assemblable polymer may exhibit an order/disorder transition temperature To/d and a glass transition temperature Tg, wherein Tg and Tg' are less than To/d, and wherein the self-assembly of the self-assemblable polymer into the ordered polymer layer takes place at a treatment temperature less than To/d and greater than Tg and Tg'.

In an embodiment, there may be provided a method for providing an ordered polymer layer at a surface of a substrate comprising:

depositing a self-assemblable polymer layer directly onto a primer layer on a substrate to provide an interface between the self-assemblable polymer layer and the primer layer, and treating the self-assemblable polymer layer to provide self-assembly into an ordered polymer layer comprising first and second domain types at the interface, wherein:

the primer layer comprises first and second chemical species, the first chemical species has a greater chemical affinity than the second chemical species for the first domain type, the second chemical species has a greater chemical affinity than the first chemical species for the second domain type, and during the self-assembly of the self-assemblable polymer layer into the ordered polymer layer, an interfacial concentration of the first chemical species increases at first loci at the interface, relative to the mean concentration of the first chemical species in the primer layer, in response to the presence of the first domain type at those first loci, and an interfacial concentration of the second chemical species increases at second loci at the interface, relative to the mean concentration of the second chemical species in the primer layer, in response to the presence of the second domain type at those second loci.

A further aspect provides a primer layer for use at an interface with a self-assemblable polymer adapted to self assemble into an ordered polymer layer comprising first and second domain types at the interface, wherein the primer layer is adapted to improve its chemical affinity for the first domain type at first loci of the interface, in response to the presence of that first domain type in the self-assemblable polymer layer at those first loci, during the self-assembly of the self-assemblable polymer layer into the ordered polymer layer.

The primer layer may be adapted to improve its chemical affinity for the second domain type at second loci of the interface, in response to the presence of that second domain type in the self-assembled polymer at those second loci, during the self-assembly of the self-assemblable polymer layer into the ordered polymer layer.

The primer layer may comprise first and second chemical species, the first chemical species having a greater chemical affinity for the first domain type than the second chemical species, and the second chemical species having a greater chemical affinity for the second domain type than the first chemical species, wherein the first chemical species is arranged to reposition towards first loci at the interface in response to the presence of the first domain type at those first loci, during the self-assembly of the self-assemblable polymer layer into the ordered polymer layer.

The second chemical species may be arranged to reposition towards the second loci at the interface in response to the presence of the second domain type at those second loci, during the self-assembly of the self-assemblable polymer layer into the ordered polymer layer.

This aspect may provide a primer layer for use at an interface with a self-assemblable polymer adapted to self assemble into an ordered polymer layer comprising first and second domain types at the interface, wherein the primer layer comprises first and second chemical species, the first chemical species having a greater chemical affinity than the second chemical species for the first domain type, and the second chemical species having a greater chemical affinity than the first chemical species for the second domain type, and wherein, during the self-assembly of the self-assemblable polymer layer into the ordered polymer layer, an interfacial concentration of the first chemical species is arranged to increase at first loci at the interface, relative to the mean concentration of the first chemical species in the primer layer, in response to the presence of the first domain type at those first loci, and an interfacial concentration of the second chemical species is arranged to increase at second loci at the interface, relative to the mean concentration of the second chemical species in the primer layer, in response to the presence of the second domain type at those second loci.

Typically, the primer layer will be provided initially in a form such that the first and second chemical species are substantially homogeneously distributed throughout the primer layer, to the extent that this is possible. There may be some association of the different chemical species, but typically the primer layer may be formed by a means adapted to reduce phase separation of the two chemical species present in the primer layer. The resulting primer layer will hence suitably present a surface which is of substantially uniform chemical affinity (i.e. neutral) relative to the self-assemblable polymer.

Similarly, the self-assemblable polymer layer will typically be deposited onto the primer layer, forming an interface therewith, by a means such as spin-coating or the like, which will provide the self-assemblable polymer layer in a substantially homogeneously distributed form, typically as a single phase or a disordered partly phase-separated layer.

The second chemical species of the primer layer may be a polymeric matrix having the first chemical species distributed therein.

The primer layer may comprise a substantially homogeneous distribution of a first polymer having a chemical affinity for the first domain type as first chemical species and a second polymer having a chemical affinity for the second domain type as second chemical species, the first and second polymers each having an end group adapted to bond an end of its respective polymer to the substrate.

For instance, in one embodiment, the primer layer may comprise a di-block copolymer, different from the self-assemblable polymer layer forming the ordered polymer layer, the di-block copolymer having a first block having a chemical affinity for the first domain type as first chemical species and a second block having a chemical affinity for the second domain type as second chemical species. The di-block copolymer may have an end group adapted to bond an end of the block copolymer to the substrate.

In an embodiment, the primer layer may comprise a branched tri-block copolymer having a first block having a chemical affinity for the first domain type as first chemical species, a second block having a chemical affinity for the second domain type as second chemical species, each bonded to a first end of a third block, wherein the opposed second end of the third block has an end group adapted to bond the second end of the third block to the substrate.

The primer layer may exhibit a glass transition temperature $Tg'$ and the self-assemblable polymer may exhibit an order/disorder transition temperature $To/d$ and a glass transition temperature $Tg$, wherein $Tg$ and $Tg'$ are less than $To/d$.

The first chemical species may, as an example, be hydrophilic and the second chemical species may be hydrophobic. In this specification the terms hydrophilic and hydrophobic when applied to a chemical species refer to whether pure distilled water will wet a layer of the chemical species (i.e. water will exhibit an equilibrium contact angle less than 90° on a surface of the chemical species) or whether pure distilled water will not wet a layer of the chemical species (i.e. water will exhibit an equilibrium contact angle greater than or equal to 90° on a surface of the chemical species). However, such extremes of behavior are not essential for putting the invention into effect—a smaller difference in behavior between the first and second chemical species may be adequate.

The primer layer may be formed, for instance, by vacuum deposition, from a melt deposited onto the substrate, or may be derived from a primer composition, by deposition or for instance by chemical reaction of a compound from the primer composition with the substrate.

A further aspect provides a primer composition for forming a primer layer described herein. Typically the primer composition will comprise the first and second chemical species dissolved or dispersed in a suitable solvent, desirably dissolved, whereby the primer layer may be deposited onto the substrate by some suitable method such as spin coating, followed by evaporation of the solvent to form the primer layer. The primer layer may be present as a melt and may be rapidly cooled in order to provide a substantially homogeneous primer layer. By the term "substantially homogeneous" in this specification it is meant that the component parts of the primer layer, such as the first and second chemical species, are mixed at a molecular level. Typically, the primer composition will contain from 0.1 to 80% by weight of the components of the polymer layer with the remainder of the composition made up of solvent, i.e. from 20 to 99.9% by weight of solvent.

In one embodiment, the primer composition may comprise a solvent having dispersed and/or dissolved therein a reactive monomer from which the second chemical species is formable by reaction and a non-reactive compound as first chemical species. The primer composition of this embodiment may further comprise an initiator adapted to initiate polymerization of the reactive monomer to form the second chemical species when subjected to a stimulus. The initiator may be an ultraviolet photoinitiator and the stimulus may be heat or irradiation with ultraviolet radiation.

In an embodiment, the primer composition may comprise a solvent having dispersed and/or dissolved therein a cross-linkable polymer and a non-reactive compound as first chemical species. The primer composition may further comprise a crosslinking compound adapted to crosslink the cross-linkable polymer when subjected to a stimulus. The stimulus may be heat or radiation such as ultraviolet radiation.

In an embodiment, the primer composition may comprise a solvent having dispersed or dissolved therein a first polymer as first chemical species and a second polymer as second chemical species, the first and second polymers each having an end group adapted to bond an end of its respective polymer to the substrate.

In an embodiment, the primer composition may comprise a solvent having dispersed or dissolved therein a di-block copolymer, the di-block copolymer having a first block as first chemical species and a second block as second chemical species. The di-block copolymer may have an end group adapted to bond an end of the block copolymer to the substrate.

In an embodiment, the primer composition may comprise a solvent having dispersed or dissolved therein a branched tri-block copolymer having a first block as first chemical species, a second block as second chemical species, each bonded to a first end of a third block, wherein the opposed second end of the third block has an end group adapted to bond the second end of the third block to the substrate.

Wherein an end group is used for bonding a polymer to the substrate, the end group may suitably comprise a hydroxyl group. Other suitable end groups may be used, instead of hydroxyl, for bonding of primer layer molecules to the substrate. For instance, the end group may be a trialkoxysilyl group, a trichlorosilyl group, a mono alkoxydichlorosilyl group, a dialkoxymonochlorosilyl group or the like.

For some embodiments, it may be appropriate to activate bonding of the end group to the surface of the substrate. For instance, for hydroxyl groups, thermal activation by heating to a temperature up to 200° C. may be appropriate.

According to a further aspect, there is provided a lithography method for patterning a surface of a substrate by resist etching, wherein the method comprises providing an ordered polymer layer at the surface by a method described herein, wherein the ordered polymer layer acts as a resist layer. The substrate may be, for example, a substrate from which devices are to be formed, or may be, for example, an imprint template for use in imprint lithography for formation of devices.

For instance, the different blocks of the ordered polymer may each exhibit different etch resistivity. Alternatively, one of the blocks may be selectively removed e.g. by photo degradation and the remaining block may serve as an etch resist.

BRIEF DESCRIPTION OF THE DRAWINGS

Specific embodiments of the invention will be described with reference to the accompanying figures, in which.

DETAILED DESCRIPTION

Figure 1A:
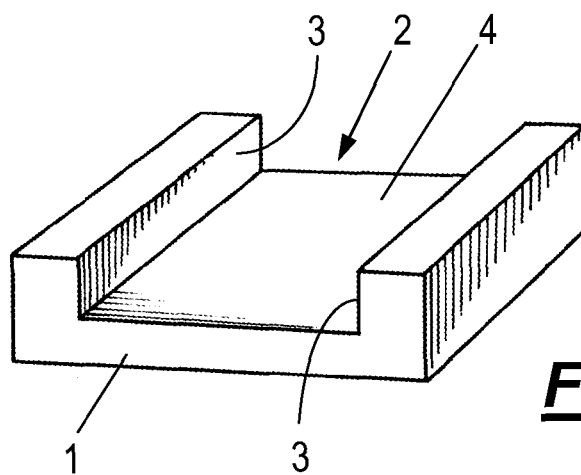
FIGS. 1A to 1C schematically depict prior art directed self-assembly of A-B block copolymers onto a substrate by graphoepitaxy and formation of relief patterns by selective etching of one domain.
Figure 1B:
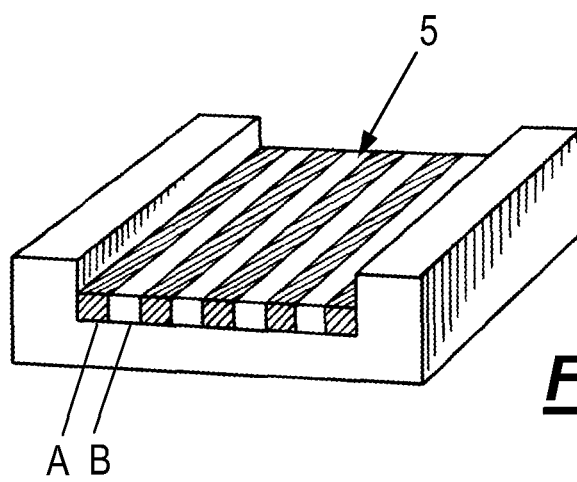
Figure 1C:
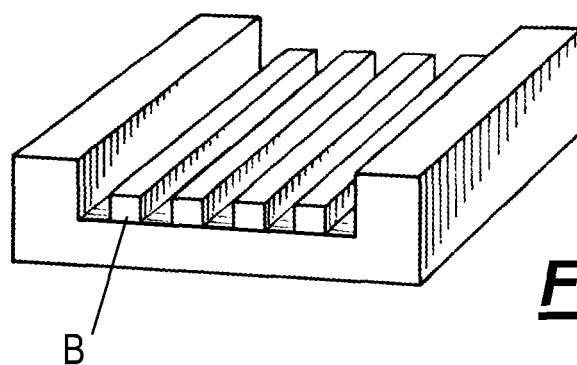

FIG. 1A shows a substrate 1 with a trench 2 formed therein bounded by side walls 3 and a bottom surface 4. In FIG. 1B, a self-assemblable A-B block copolymer with lyophilic (e.g., hydrophilic) A blocks and lyophobic (e.g., hydrophobic) B blocks has been deposited into the trench to form a layer 5 with alternating stripes of A and B domains which have deposited as a lamellar phase separated into discrete micro-separated periodic domains during deposition of the block copolymer. This is referred to as graphoepitaxy. The type A domains have nucleated adjacent to the side walls 3, which are also lyophilic. In FIG. 1C, the type A domains have been removed by selective chemical etching, leaving the type B domains to form a relief pattern in the trench where they may serve as a template for subsequent patterning of the bottom surface 4, for instance by further chemical etching. Selective removal may also be achieved, for instance, by selective photodegradation or photo-cleavage of a linking agent between blocks of the copolymer and subsequent solubilization of one of the blocks. The pitch or wavelength of the self-assembled polymer structure 5 and the width of the trench 4 are arranged so that a number of alternating stripes of domains can fit into the trench between the sidewalls with a type A domain against each side wall.

Figure 2A:
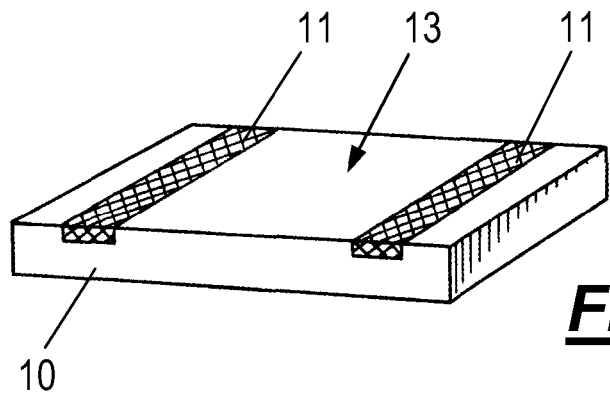
FIGS. 2A to 2C schematically depict prior art directed self-assembly of A-B block copolymers onto a substrate by chemical pre-patterning and formation of relief patterns by selective etching of one domain.
Figure 2B:
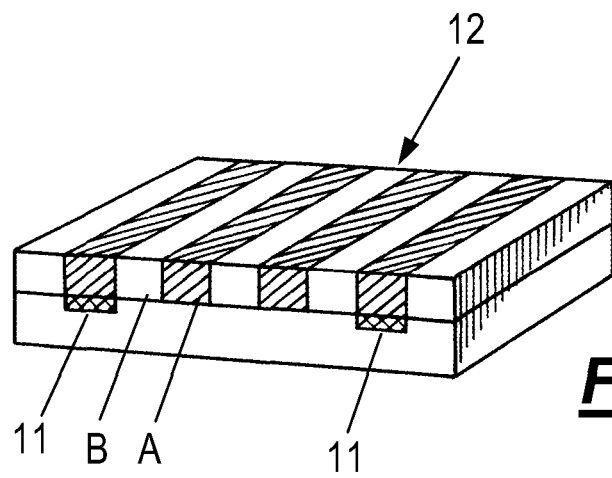
Figure 2C:
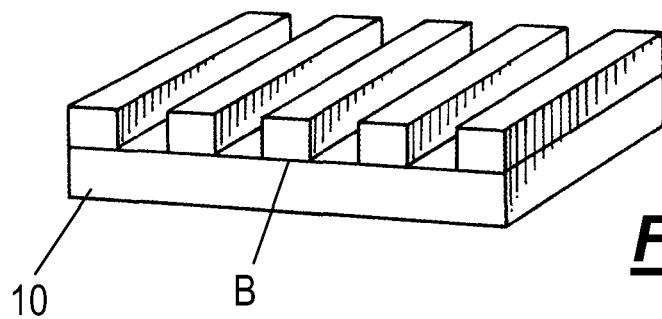

FIG. 2A shows a substrate 10 with a chemical pattern in the form of pinning stripes 11 which have been chemically formed on the surface 13 to provide regions with a higher affinity for the type A blocks of the polymer. In FIG. 2B, a self-assemblable A-B block copolymer with lyophilic (e.g., hydrophilic) A blocks and lyophobic (e.g., hydrophobic) B blocks has been deposited onto the surface 13 of substrate 10 to form a lamellar phase layer 12 with alternating stripes of A and B domains which have phase separated into discrete micro-separated periodic domains during deposition of the block copolymer. This is referred to as chemical pre-patterning. The type A domains have nucleated atop the pinning stripes 11, which are also lyophilic (e.g., hydrophilic). In FIG. 1C, the type A domains have been removed by selective chemical etching, leaving the type B domains to form a relief pattern on the surface 13 where they may serve as a template for subsequent patterning of surface 13, for instance by further chemical etching. The pitch or wavelength of the self-assembled polymer structure 12 and the spacing of the pinning stripes 11 are arranged so that a number of alternating stripes of domains can fit between the pinning stripes 11 with a type A domain atop each pinning stripe 11.

Figure 3A:
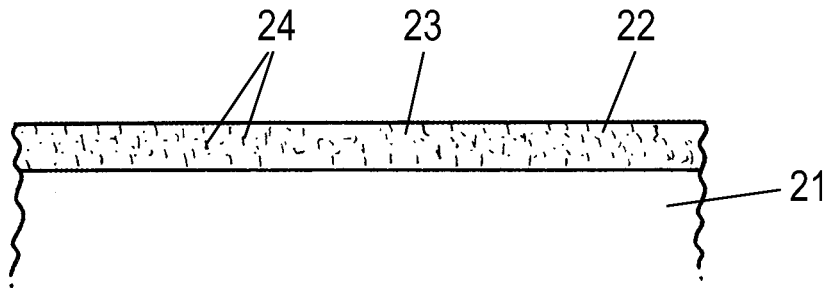
FIGS. 3A to 3C schematically depict a method according to a first embodiment of the invention for forming a self-assembled ordered polymer layer on a substrate.
Figure 3B:
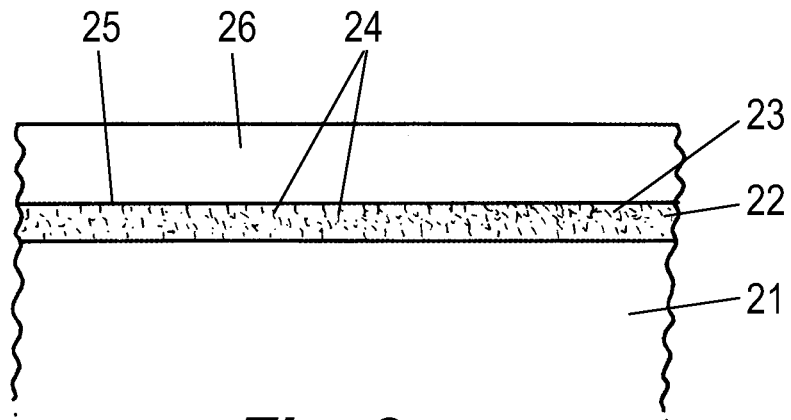
Figure 3C:
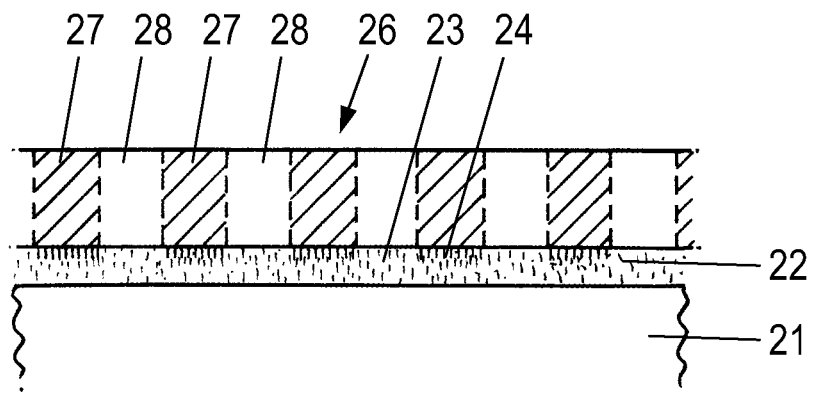

Turning to FIGS. 3A to 3C, these depict a method according to an embodiment of the invention. In this embodiment, a mixture of a reactive monomer X, a non-reactive compound Y and photo initiator Z is applied from solution onto substrate 21 by spin-coating or other means to form a primer layer 22. The reactive monomer X is a reactive compound (alternatively a mixture of reactive compounds may be used) that has a high chemical affinity for block B of a self-assemblable block copolymer A-B. Reactive monomer X is capable of forming a crosslinked polymer network after photopolymerization. Following deposition of the primer layer 22, a polymerization reaction of reactive monomer X can be initiated by photoinitiator Z upon irradiation with actinic radiation (e.g., ultraviolet light) of the appropriate wavelength. The non-reactive compound Y 24 has molecular properties that are highly similar to block A of the block copolymer A-B, giving it a high chemical affinity for that block. After application of a thin film (say 1 nm-100 nm in thickness) of the mixture onto the substrate, the film is exposed to actinic radiation (e.g., UV light) and photopolymerization of the reactive monomer occurs resulting in the formation of an insoluble crosslinked polymer network 23 in which non-reactive compound Y 24 is homogeneously distributed. This results in a primer layer 22 having surface properties intermediate between those of block A and block B (i.e. a neutral surface).

Thereafter, a thin layer 26 (say 1-100 nm) of the self-assemblable polymer, block copolymer A-B, is coated on the top of the primer layer 22 to form an interface 25 between the primer layer 22 and the block copolymer layer 26. The block copolymer A-B is deposited in an unordered—unassembled state. Subsequently the entire assembly is annealed at a temperature above the glass transition temperature of both the primer layer 22 (Tg') and the glass transition temperature of the block copolymer A-B 26 (Tg) but below the order-disorder transition temperature To/d of the block copolymer A-B. During this annealing, the block copolymer has adequate mobility to self-assemble into regular patterns having first domains 27 of A blocks and second domains 28 of B-blocks, while the non-reactive compound Y 24 has the mobility within the polymer matrix 23 formed from reactive monomer X to diffuse towards first loci at the interface 25 that are covered with block A of the assembling or assembled block copolymer A-B. Because of the high chemical affinity between non-reactive compound Y 24 and block A the interfacial energy at these first loci will be reduced or minimized. As a result of the diffusion of compound Y 24 towards the first loci covered with block A, there will be an increased interfacial concentration of compound Y 24 at the first loci which is higher than the mean concentration of compound Y in the primer layer 22. This also leads to a depletion of compound Y 24 in the second loci which are covered by block B of the block copolymer. Hence, in these second loci, the interfacial energy will be reduced as a result of an increased interfacial concentration in the polymer 23 of monomer X. Without wishing to be bound be any scientific theory, it is thought that the reduction in interfacial energy at the interface 25 between the primer layer 22 and the block copolymer layer 26 results in a reduction in defect density for the resulting ordered polymer layer compared to an equivalent layer formed without the use of the primer layer of an embodiment of the invention. This may in addition or alternatively lead to an improvement in the persistence length of the ordered polymer layer.

Instead of an ultraviolet photoinitiation, other actinic radiation may be used with an appropriate photoinitiator. Alternatively, for instance, thermal initiation of polymerization may be used, or e-beam irradiation may be employed to cause initiation of reaction.

Instead of a single reactive monomer X, a plurality of reactive monomers may be employed.

The composition of the mixture X, Y, Z may be optimized for a specific self-assemblable polymer, but in general $0.2 <$ (weight of X)/(weight of Y)$<5$ and $0.001 <$(weight of Z)/[(weight of X)+(weight of Y)]$<0.05$, where the "weight" refers to the weight of component in the primer layer.

If irradiation to polymerize reactive monomer X is carried out through a mask, it is possible to polymerize the mixture only in the areas that are illuminated through the mask and to wash away the unreacted mixture in non-irradiated areas. In this way it is possible to leave areas of the substrate uncovered by the primer layer. These bare substrate areas may be used as chemical alignment marks or template structure for chemoepitaxy and/or graphoepitaxy, with preferential interaction of the bare substrate with one of the domains of copolymer blocks A or B, and so can be used for registration, alignment and directing of the self-assembly pattern. Alternatively, a substantially uniform (i.e. flood) exposure intensity can be used to solidify the primer layer by crosslinking and a resist layer can be applied on top of the resulting crosslinked primer layer. Subsequently, the resist layer can be patterned via top down lithography to provide a topological pre-pattern to establish registration, alignment and directing of the self-assembly pattern. At room temperature the primer layer will typically be in a vitrified state (i.e. having a glass transition temperature Tg' greater than room temperature).

Instead of forming the crosslinked polymer 23 in the primer layer 22 from a reactive monomer X, the primer layer may be deposited from a primer layer composition comprising a crosslinkable polymer having a non-reactive compound Y 24 homogeneously distributed therein. Following deposition of the primer layer 22, the crosslinkable polymer layer may then be crosslinked to form the crosslinked polymer 23 having the compound Y 24 therein.

Figure 4A:
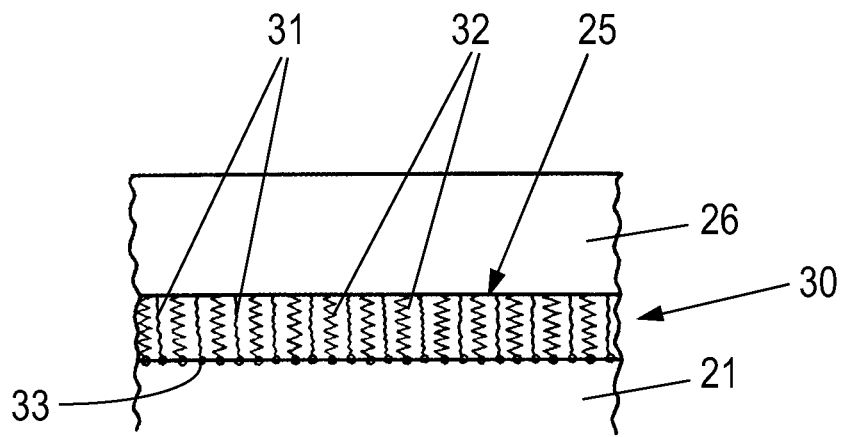
FIGS. 4A and 4B schematically depict a process according to a second embodiment of the invention for forming an ordered polymer layer on a substrate.
Figure 4B:
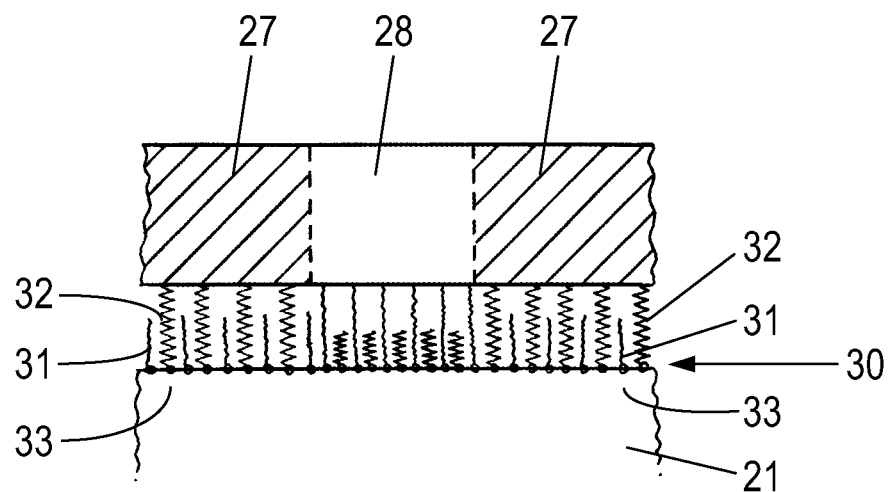

Turning to FIGS. 4A and 4B, the primer layer 30 in this embodiment comprises a mixture of brush homopolymers P 31 and Q 32 with reactive hydroxyl end groups 33. The end group 33 bonds an end of each molecule of brush homopolymer P 31 or Q 32 to the surface of the substrate 21 to form a homogeneous brush polymer monolayer as primer layer 30.

Homopolymer brush P 31 has a high chemical affinity with block B in the layer 26 of self-assemblable block copolymer A-B and homopolymer brush Q 32 has a high chemical affinity with block A in the layer 26 of self-assemblable block copolymer A-B. The resulting primer layer 30, when in a homogeneous state, has chemical properties intermediate between blocks A and B of the block copolymer A-B and hence may show equal wetting properties for both blocks (i.e. neutral behavior) and may thus, for instance, induce perpendicular orientation of the self-assembly pattern in self-assemblable polymer layer 26.

A thin layer 26 (say 1-100 nm, or 10-60 nm) of the block copolymer A-B is applied on top of the mixed brush layer, via spin coating or other suitable coating technique. Subsequently, the entire assembly is annealed at a temperature above the glass transition temperature Tg of the block copolymer A-B but below the order-disorder transition To/d of the block copolymer A-B. During annealing the block copolymer A-B has the mobility to self-assemble into regular domains of type A 27 and type B 28 blocks. Without wishing to be bound by any scientific theory, it is thought that in response to the formation of the self-assembly pattern in the layer 26 of block copolymer A-B, the brush polymers P 31 will extend their chains towards the interface 25 in second loci covered by type B domains 28 and in the same second loci brush polymer Q 32 will reposition to a more collapsed chain conformation. Because of the high chemical affinity between polymer P 31 and block B, the interfacial energy in these areas will be reduced. In contrast brush polymers Q 32 are believed to take on an extended chain conformation in the first loci covered by domains 27 of block A, and in the same first loci, polymers P 31 will exhibit a collapsed chain conformation, repositioning away from the first loci. It is thought that the self-regulating minimization of the interfacial energy between the primer layer 30 and the self-assemblable block copolymer layer 26 may result in a reduction in defect density for the resulting ordered polymer layer compared to an equivalent layer formed without the use of the primer layer of an embodiment of the invention. There may alternatively or in addition be an improvement in the persistence length of the ordered polymer layer.

The reactive end group 33 is hydroxyl in the example set out in FIGS. 4A and 4B, but may be any suitable end group. The primer layer in this embodiment will typically have a thickness of 1-100 nm, or 1-10 nm.

In order to form the primer layer 30, the polymers P 31 and Q 32 may be deposited together or one of the brush homopolymers P 31 may be reacted with the surface first and the reaction stopped at incomplete coverage of the surface. Subsequently the second brush homopolymer Q 32 may be reacted with the surface until complete coverage is reached and a homogeneous mixed brush layer is obtained as primer layer 30.

A topological or chemical pre-pattern may be applied to the primer layer of this embodiment by top down lithography. For this purpose a resist layer may be deposited, for instance by spin-casting, on top of the substrate provided with the mixed brush layer. Subsequently, the resist layer may be patterned in a lithographic step. The resulting resist pattern may serve as a graphoepitaxy pattern for registration, alignment and directing of the self-assembly pattern. Alternatively, the patterned resist layer may serve as an etch mask for etching the primer layer and in this way may provide a chemical pre-pattern after stripping of the resist layer.

Figure 5:
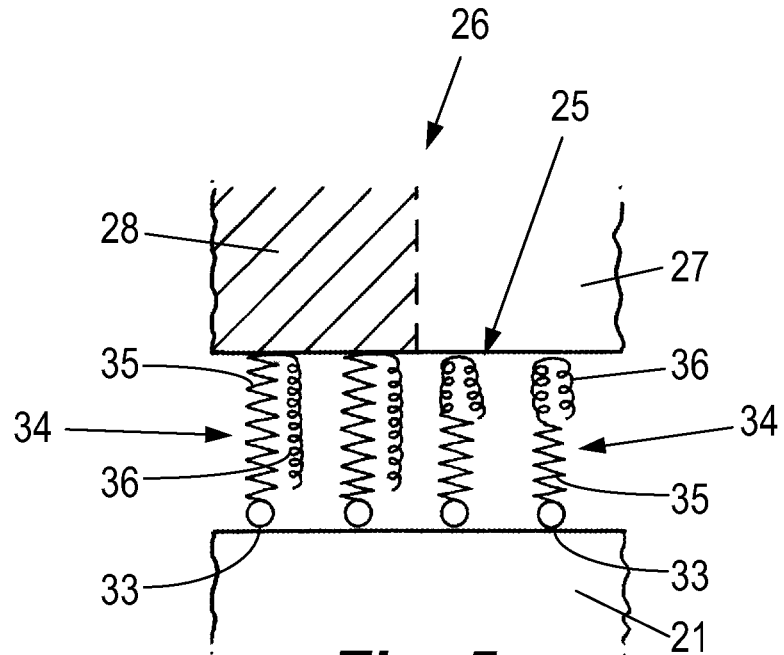
FIG. 5 schematically depicts the detailed molecular configurations for components a primer layer according to a third embodiment of the invention.

Turning to FIG. 5, this shows an embodiment of the invention wherein the primer layer consists essentially of a di-block copolymer R-S 34 having blocks R 35 and S 36 as its blocks with a reactive hydroxyl end group 33 at the free end of block R 35 which is bonded to the surface of the substrate to form a uniform brush di-block copolymer monolayer, typically with a thickness of 1-100 nm, or 1-10 nm.

Block R 35 of the brush di-block copolymer 34 has a high chemical affinity with block B of the self assemblable block copolymer A-B (for instance block R 35 and block B may be of the same monomer as block B). Block S 36 of the brush di-block copolymer 34 has a high chemical affinity for block A of the self assemblable block copolymer A-B (for instance block S 36 may be of the same monomer as block A). Without wishing to be bound by theory, it is thought that change in the conformation of the brush block copolymer R-S 34 may lead to either block R 35 or block S 36 being repositioned towards first and second loci at the interface 25 depending upon whether the interface is covered at these respective loci by domain type A 27 or domain type B 28.

When initially deposited, the primer layer of brush di-block copolymer R-S may exhibit a random conformation, having a chemical affinity intermediate between that of blocks A and B of the self-assemblable polymer (block copolymer A-B), and hence may show substantially uniform wetting properties for both block types. This may induce perpendicular orientation of the self-assemblable polymer pattern. Although such a random conformation of the brush di-block copolymer R-S 34 in the primer layer may be thermodynamically unfavorable, this may be achieved by kinetic trapping when the primer layer is flooded with a good solvent for both block types R 35 and S 36 and subsequently rapidly dried, for instance by evaporation of the solvent.

After provision of the primer layer 34, a thin layer 26 (1-100 nm, desirably 20-60 nm) of the self-assemblable polymer (block copolymer A-B) is applied on top of the primer layer, via spin coating or other suitable coating technique. Subsequently, the entire assembly may be annealed at a temperature above the glass transition temperature Tg of the self-assemblable polymer (block copolymer A-B) and above the glass transition temperature Tg' of the primer layer but below the order-disorder transition To/d of the self-assemblable polymer.

Without wishing to be bound by any scientific theory, it is believed that, during annealing, the self-assemblable polymer has the mobility to self-assemble into regular patterns. In response to the formation of the self-assembly pattern in the self-assemblable polymer layer 26, the brush di-block copolymer R-S 34 may adapt its conformation and direct block R 35 towards the interface 25 at second loci covered by second domain 28 of type B. The high similarity in molecular properties between block R 35 and block A may lead to a reduction in interfacial energy at the first loci. In an analogous manner, the brush di-block copolymers R-S 34 may adapt a conformation in which block S 36 is repositioned towards the interface 25 at first loci covered by first domain 27 of type A. It is believed that the self-regulatory minimization of the interfacial energy at the interface arising from such a mechanism may result in a reduction in defect density for the resulting ordered polymer layer, formed from the self-assemblable polymer, compared to an equivalent layer formed without the use of the primer layer of an embodiment of the invention. There may also or alternatively be an improvement in the persistence length of the ordered polymer layer.

Prior to deposition of the self-assemblable polymer layer 26 onto the primer layer, a topological or chemical pre-pattern can be applied to the primer layer by top down lithography. For this purpose a resist layer may be spun-cast onto the primer layer. Subsequently, the resist layer may be patterned in a lithographic step. The resulting resist pattern can serve as a graphoepitaxy pattern for registration, alignment and directing of the self-assembly pattern for the self-assemblable polymer layer 26. Alternatively, the patterned resist layer can serve as etch mask for etching the primer layer and in this way provide a chemical pre-pattern for alignment of the self-assemblable polymer layer 26 after stripping of the resist layer. It may alternatively be appropriate to first apply a graphoepitaxy pre-pattern to the substrate and then subsequently to apply a primer layer.

Figure 6:
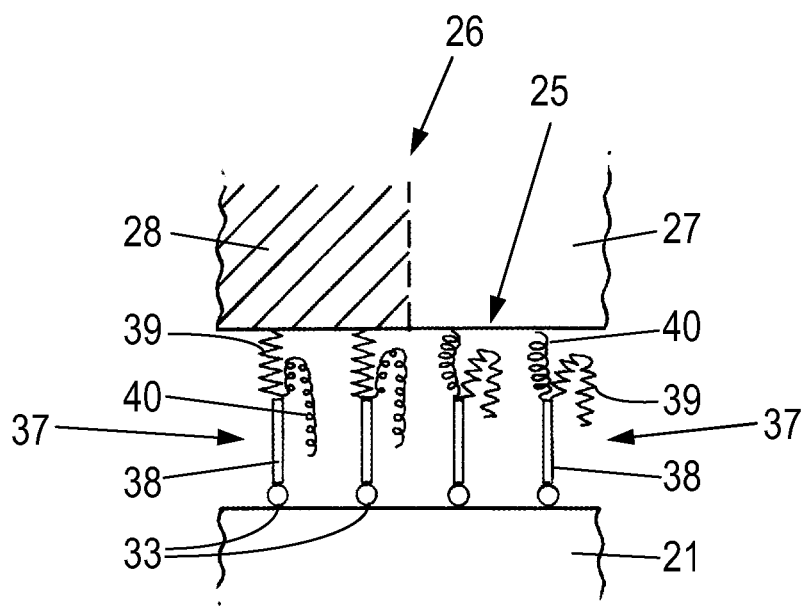
FIG. 6 schematically depicts the detailed molecular configurations for a primer layer according to a fourth embodiment of the invention.

Turning to FIG. 6, this schematically depicts an arrangement similar to that of the embodiment detailed above in relation to FIG. 5, but wherein a branched brush tri-block copolymer 37 is used for the primer layer instead of the di-block copolymer R-S 34.

The branched brush tri-block copolymer 37 has a first block or branch V 40 which has a high chemical affinity for block A of the self-assemblable polymer (copolymer A-B). For instance block V 40 may be of the same monomer as block A of the block copolymer A-B. The second block or branch W 39 of the branched brush tri-block copolymer has a high chemical affinity for block B of the block copolymer A-B. For instance, block W 39 may be of the same monomer as block B of the block copolymer A-B.

Each block or branch 39, 40 is bonded to a first (distal) end of a third block or stem 38 of the tri-block copolymer 37. The second (proximal) end of the third block or stem 38 has a hydroxyl end group 33 suitable for bonding the second end of the third block 38 to the substrate 21 to form a uniform primer layer of brush tri-block copolymer monolayer, typically with a thickness of 1-100 nm, or 1-10 nm.

After provision of the primer layer of tri-block copolymer 37, a thin layer (1-100 nm, desirably 20-60 nm) of the block copolymer A-B is applied on top of the brush block copolymer layer, via spin coating or other suitable coating technique. Subsequently, the sample is annealed at a temperature above the glass transition temperature of the block copolymer but below the order-disorder transition of the block copolymer.

Without wishing to be bound by theory, it is thought that during annealing, the self-assemblable polymer has the mobility to self-assemble into regular patterns. In response to the formation of the self-assembly pattern in the self-assemblable polymer layer 26, the branched brush tri-block copolymer 37 may adapt its conformation to reposition first block V 40 towards the interface 25 at the first loci covered by first domain 27 of block A. The high chemical affinity between first block V 40 and block A may lead to a reduction in interfacial energy in these first loci. Similarly, at second loci where the interface 25 is covered by second domain 28 of block B, the branched brush tri-block copolymer 37 may adapt its conformation in which block W 39 is repositioned towards the second loci, which may lead to a further reduction in interfacial energy.

Such self-regulated reduction of the interfacial energy at the interface 25 between the self-assemblable polymer layer 26 and the primer layer may result in a reduction in defect density for the resulting ordered polymer layer compared to a polymer layer ordered directly on a substrate without the primer layer of an embodiment of the invention. There may also or alternatively be an improvement in the persistence length of the ordered polymer layer.

Prior to deposition of the self-assemblable polymer layer 26 onto the primer layer, a topological or chemical pre-pattern can be applied to the primer layer by top down lithography. For this purpose a resist layer may be spun-cast onto the primer layer. Subsequently, the resist layer may be patterned in a lithographic step. The resulting resist pattern can serve as a graphoepitaxy pattern for registration, alignment and directing of the self-assembly pattern for the self-assemblable polymer layer 26. Alternatively, the patterned resist layer can serve as etch mask for etching the primer layer and in this way may provide a chemical pre-pattern for alignment of the self-assemblable polymer layer 26 after stripping of the resist layer. It may alternatively be appropriate to first apply a graphoepitaxy pre-pattern to the substrate and then subsequently to apply a primer layer.

Figure 7A:
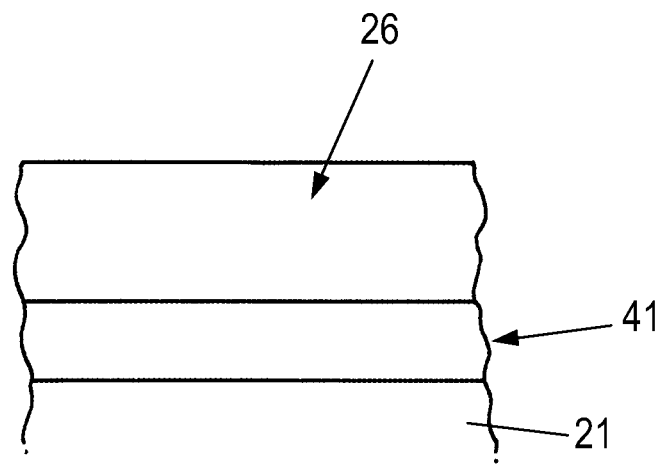
FIGS. 7A and 7B schematically depict a method according to a fifth embodiment of the invention for forming a self-assembled ordered polymer layer on a substrate.
Figure 7B:
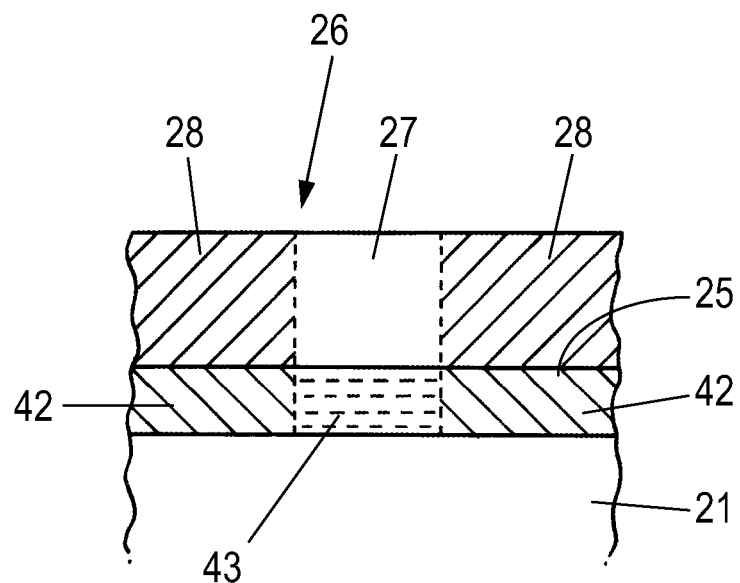

Turning to FIGS. 7A and 7B, these provide a schematic depiction of a further embodiment of the invention. In this embodiment, a primer layer 41 of a second self-assemblable di-block copolymer G-H has been provided on the substrate 21 and deposited in a manner so that it is in a substantially homogeneous, unordered state (e.g. by spin-coating). The primer layer 41 is a substantially uniform layer, typically with a thickness of 1-100 nm, or 20 to 60 nm.

In this embodiment, the di-block copolymer G-H is not acting as a brush polymer layer. The second self-assemblable block copolymer G-H has a glass transition temperature $Tg''$ and an order/disorder transition temperature $To/d''$.

Following provision of the primer layer, a thin layer 26 (for instance 1-100 nm, or 20-60 nm) of the self-assemblable polymer (block copolymer A-B) is applied on top of the primer layer 41, again via spin coating or other suitable coating technique.

Subsequently, the sample is annealed at a temperature above the glass transition temperatures $Tg$, $Tg''$ of the block copolymers of the two layers 26, 41 but below the order/disorder transition temperatures $To/d$ and $To/d''$ of the block copolymers of the two layers 26, 41.

During annealing the self-assemblable polymer (i.e. first block copolymer A-B) has the mobility to self-assemble into regular patterns. In response to the formation of the self-assembly pattern in the first block copolymer layer, the second block copolymer G-H will also self-assemble into domain 42 of block H and into domain 43 of block G. In particular, block G will reposition towards first loci at the interface 25 covered by first domain 27 of block A. The high chemical affinity between blocks A and G high will lead to a reduction in interfacial energy at these first loci. Similarly, block H of the second block copolymer G-H will reposition towards second loci at the interface 25 covered by second domain 28 of block B. The high chemical affinity between blocks B and H high may lead to a further reduction in interfacial energy at these second loci.

The first block G of the di-block copolymer has a high chemical affinity for the first block A of the self-assemblable polymer (copolymer A-B) and the second block H of the di-block copolymer has a high chemical affinity for the second block B of the self-assemblable polymer (copolymer A-B), but at least one of G and H is of a different monomer to A or B respectively (i.e. the di-block copolymer G-H is different from the copolymer A-B). Suitably, the self-assembled pattern formed by the second self-assemblable polymer (di-block copolymer G-H) has a similar or substantially identical space group (i.e. translational symmetry) and periodicity to the ordered polymer layer formed by the first self-assemblable polymer (copolymer A-B).

Without wishing to be bound by theory, it is thought that self-regulating minimization of the interfacial energy contrast between the two layers 26, 41 of self-assemblable polymers may give rise to reduction in the defect density for the resulting ordered polymer layer compared to an equivalent layer formed without the use of the primer layer of an embodiment of the invention, by means of a mechanism where each layer acts to reduce defects in the other layer by a mutual healing mechanism driven be reduction in overall interfacial free energy. There may also or alternatively be an improvement in the persistence length of the ordered polymer layer.

In some circumstances, it may be beneficial for the primer layer to have a Tg below the Tg of the block copolymer A-B, and to order the primer layer first. The block copolymer A-B may then be deposited and ordered under conditions such that the primer layer is not disordered again.

Prior to deposition of the self-assemblable polymer layer 26 onto the primer layer 41, a topological or chemical prepattern can be applied to the primer layer by top down lithography. For this purpose a resist layer may be spun-cast onto the primer layer. Subsequently, the resist layer may be patterned in a lithographic step. The resulting resist pattern can serve as a graphoepitaxy pattern for registration, alignment and directing of the self-assembly pattern for the self-assemblable polymer layer 26. Alternatively, the patterned resist layer can serve as etch mask for etching the primer layer and in this way may provide a chemical pre-pattern for alignment of the self-assemblable polymer layer 26 after stripping of the resist layer.

Typically a chemical or topological pre-pattern may be used to direct, align or register the self-assemblable polymer layer as it forms an ordered polymer layer pattern using the methods and/or compositions of embodiments of the invention. However, the methods and/or compositions may also be used without the use of a chemical or topological template pattern, particularly, for instance, in applications where pattern persistence is important but direction and alignment are not specifically required.

In applications where a pre-pattern is used, the greater persistence length and/or lower defect level obtainable by use of an embodiment of the invention may permit the use of a sparser pre-pattern without loss of precision in the resulting pattern formed.

An embodiment of the present invention relates to lithography methods. The methods may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc. An embodiment of the invention is also of use to create regular nanostructures on a surface for use in the fabrication bit-patterned media or discrete track media for magnetic storage devices (e.g. for hard drives).

In particular, the invention is of use for high resolution lithography, where features patterned onto a substrate have a feature width or critical dimension of about 1 μm or less, typically 100 nm or less or even 10 nm or less.

Lithography may involve applying several patterns onto a substrate, the patterns being stacked on top of one another such that together they form a device such as an integrated circuit. Alignment of each pattern with a previously provided pattern is an important consideration. If patterns are not aligned with each other sufficiently accurately, then this may result in some electrical connections between layers not being made. This, in turn, may cause a device to be non-functional. Lithographic apparatus therefore usually includes an alignment apparatus, which may be used to align each pattern with a previously provided pattern, and/or with alignment marks provided on the substrate.

In this specification, the term "substrate" is meant to include any surface layer forming part of the substrate, or being provided on a substrate, such as a planarization layer or anti-reflection coating layer. The primer layer, as described in this specification, is not considered as part of the substrate, but is provided on the substrate. The self-assemblable polymer layer, which is provided directly on the primer layer, is also not considered as part of the substrate.

While specific embodiments of the invention have been described above, it will be appreciated that the invention may be practiced otherwise than as described. For example, the invention may take the form of a computer program containing one or more sequences of machine-readable instructions configured to cause performance of a method as disclosed above, or a computer-readable data storage medium (e.g. semiconductor memory, magnetic or optical disk) having such a computer program stored therein.

The descriptions above are intended to be illustrative, not limiting, Thus, it will be apparent to those skilled in the art that modifications may be made to the invention as described without departing from the scope of the claims set out below.

The invention claimed is:

1. A method for providing an ordered polymer layer at a surface of a substrate comprising:
depositing a self-assemblable polymer layer directly onto a primer layer on a substrate to provide an interface between the self-assemblable polymer layer and the primer layer, and
treating the self-assemblable polymer layer to provide self-assembly into an ordered polymer layer comprising first and second domain types at the interface,
wherein the primer layer is adapted to improve its chemical affinity for the first domain type at first loci of the interface, in response to the presence of that first domain type in the self-assembled polymer at those first loci, during the self-assembly of the self-assemblable polymer layer into the ordered polymer layer.

2. The method of claim 1, wherein the primer layer is adapted to improve its chemical affinity for the second domain type at second loci of the interface, in response to the presence of that second domain type in the self-assembled polymer at those second loci, during the self-assembly of the self-assemblable polymer layer into the ordered polymer layer.

3. The method of claim 1, wherein the primer layer comprises first and second chemical species,
the first chemical species having a greater chemical affinity than the second chemical species for the first domain type, and
the second chemical species having a greater chemical affinity than the first chemical species for the second domain type, and
wherein the first chemical species repositions towards the first loci at the interface in response to the presence of the first domain type at those first loci, during the self-assembly of the self-assemblable polymer layer into the ordered polymer layer.

4. The method of claim 3, wherein the second chemical species repositions towards the second loci at the interface in response to the presence of the second domain type at those second loci, during the self-assembly of the self-assemblable polymer layer into the ordered polymer layer.

5. The method of claim 3, wherein the second chemical species is a polymeric matrix having the first chemical species distributed therein.

6. The method of claim 5, wherein a composition comprising a reactive monomer and a non-reactive compound is deposited onto the surface of the substrate and the monomer is reacted to form the polymer matrix as second chemical species having the non-reactive compound as first chemical species substantially homogeneously distributed therein to provide the primer layer.

7. The method of claim 5, wherein a composition comprising a cross-linkable polymer and a non-reactive compound is deposited onto the surface of the substrate and the cross-linkable polymer is reacted to form the polymer matrix as second chemical species having the non-reactive compound as first chemical species substantially homogeneously distributed therein to provide the primer layer.

8. The method of claim 1, wherein the primer layer comprises a substantially homogeneous distribution of a first polymer having a chemical affinity for the first domain type as first chemical species and a second polymer having a chemical affinity for the second domain type as second chemical species, the first and second polymers each having an end group adapted to bond an end of its respective polymer to the substrate.

9. The method of claim 1, wherein the primer layer comprises a di-block copolymer, different from the self-assemblable polymer layer forming the ordered polymer layer, the di-block copolymer having a first block having a chemical affinity for the first domain type as first chemical species and a second block having a chemical affinity for the second domain type as second chemical species.

10. The method of claim 9, wherein the di-block polymer has an end group adapted to bond an end of the block copolymer to the substrate.

11. The method of claim 1, wherein the primer layer comprises a branched tri-block copolymer having a first block having a chemical affinity for the first domain type as first chemical species, a second block having a chemical affinity for the second domain type as second chemical species, each bonded to a first end of a third block, wherein an opposed second end of the third block has an end group adapted to bond the second end of the third block to the substrate.

12. The method of claim 1, wherein the primer layer exhibits a glass transition temperature Tg' and the self-assemblable polymer exhibits an order/disorder transition temperature To/d and a glass transition temperature Tg, wherein Tg and Tg' are less than To/d, and wherein the self-assembly of the self-assemblable polymer into the ordered polymer layer takes place at a treatment temperature less than To/d and greater than Tg and Tg'.

13. A primer layer for use at an interface with a self-assemblable polymer adapted to self assemble into an ordered polymer layer comprising first and second domain types at the interface, wherein the primer layer is adapted to improve its chemical affinity for the first domain type at first loci of the interface, in response to the presence of that first domain type in the self-assemblable polymer layer at those first loci, during the self-assembly of the self-assemblable polymer layer into the ordered polymer layer.

14. The primer layer of claim 13, wherein the primer layer is adapted to improve its chemical affinity for the second domain type at second loci of the interface, in response to the presence of that second domain type in the self-assembled polymer at those second loci, during the self-assembly of the self-assemblable polymer layer into the ordered polymer layer.

15. The primer layer of claim 13, wherein the primer layer comprises first and second chemical species,
the first chemical species having a greater chemical affinity for the first domain type than the second chemical species, and
the second chemical species having a greater chemical affinity for the second domain type than the first chemical species, and
wherein the first chemical species is arranged to reposition towards first loci at the interface in response to the presence of the first domain type at those first loci, during the self-assembly of the self-assemblable polymer layer into the ordered polymer layer.

16. The primer layer of claim 15, wherein the second chemical species is arranged to reposition towards the second loci at the interface in response to the presence of the second domain type at those second loci, during the self-assembly of the self-assemblable polymer layer into the ordered polymer layer.

17. The primer layer of claim 15, wherein the second chemical species is a polymeric matrix having the first chemical species distributed therein.

18. The primer layer of claim 15, wherein the primer layer comprises a substantially homogeneous distribution of a first polymer having a chemical affinity for the first domain type as first chemical species and a second polymer having a chemical affinity for the second domain type as second chemical species, the first and second polymers each having an end group adapted to bond an end of its respective polymer to the substrate.

19. A method for providing an ordered polymer layer at a surface of a substrate comprising:
depositing a self-assemblable polymer layer directly onto a primer layer on a substrate to provide an interface between the self-assemblable polymer layer and the primer layer, and
treating the self-assemblable polymer layer to provide self-assembly into an ordered polymer layer comprising first and second domain types at the interface, wherein:
the primer layer comprises first and second chemical species,
the first chemical species has a greater chemical affinity than the second chemical species for the first domain type,
the second chemical species has a greater chemical affinity than the first chemical species for the second domain type, and
during the self-assembly of the self-assemblable polymer layer into the ordered polymer layer,
an interfacial concentration of the first chemical species increases at first loci at the interface, relative to the mean concentration of the first chemical species in the primer layer, in response to the presence of the first domain type at those first loci, and
an interfacial concentration of the second chemical species increases at second loci at the interface, relative to the mean concentration of the second chemical species in the primer layer, in response to the presence of the second domain type at those second loci.

20. A lithography method for patterning a surface of a substrate by resist etching, wherein the method comprises providing an ordered polymer layer at the surface by a method for providing an ordered polymer layer at a surface of a substrate comprising:
depositing a self-assemblable polymer layer directly onto a primer layer on a substrate to provide an interface between the self-assemblable polymer layer and the primer layer, and
treating the self-assemblable polymer layer to provide self-assembly into an ordered polymer layer comprising first and second domain types at the interface,
wherein the primer layer is adapted to improve its chemical affinity for the first domain type at first loci of the interface, in response to the presence of that first domain type in the self-assembled polymer at those first loci, during the self-assembly of the self-assemblable polymer layer into the ordered polymer layer,
wherein the ordered polymer layer acts as a resist layer.

* * * * *